United States Patent
Fujiwara et al.

(10) Patent No.: US 10,706,934 B2
(45) Date of Patent: Jul. 7, 2020

(54) FAILURE DETECTION CIRCUITRY FOR ADDRESS DECODER FOR A DATA STORAGE DEVICE

(71) Applicant: Taiwan Semiconductor Manufacturing Co., Ltd., Hsinchu (TW)

(72) Inventors: Hidehiro Fujiwara, Hsinchu (TW); Ching-Wei Wu, Nantou County (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 16/510,168

(22) Filed: Jul. 12, 2019

(65) Prior Publication Data

US 2019/0333584 A1    Oct. 31, 2019

Related U.S. Application Data

(63) Continuation of application No. 16/160,406, filed on Oct. 15, 2018, now Pat. No. 10,354,731, which is a
(Continued)

(51) Int. Cl.

| | |
|---|---|
| *G06F 11/00* | (2006.01) |
| *G11C 16/08* | (2006.01) |
| *G11C 29/02* | (2006.01) |
| *G11C 8/10* | (2006.01) |
| *G11C 5/02* | (2006.01) |
| *G11C 5/06* | (2006.01) |
| *G11C 16/10* | (2006.01) |
| *G11C 16/34* | (2006.01) |

(Continued)

(52) U.S. Cl.
CPC .............. *G11C 16/08* (2013.01); *G11C 5/025* (2013.01); *G11C 5/063* (2013.01); *G11C 8/10* (2013.01); *G11C 16/105* (2013.01); *G11C 16/3481* (2013.01); *G11C 29/024* (2013.01); *G11C 29/025* (2013.01); *G11C 29/14* (2013.01); *G11C 29/783* (2013.01); *G11C 8/08* (2013.01); *G11C 8/20* (2013.01)

(58) Field of Classification Search
CPC ......... G11C 16/08; G11C 5/025; G11C 5/063; G11C 16/105
USPC ...................................... 365/230.01
See application file for complete search history.

(56) References Cited

U.S. PATENT DOCUMENTS 5,500,822 A    3/1996 Han
6,473,872 B1    10/2002 Hoffman
(Continued)

*Primary Examiner* — Xiaochun L Chen
(74) *Attorney, Agent, or Firm* — Sterne, Kessler, Goldstein & Fox P.L.L.C.

(57) ABSTRACT

A data storage device can detect for a failure in decoding of an x-bit row address and/or a y-bit column of an (x+y)-bit address. The data storage device decodes the x-bit row address and/or the y-bit column address to provide wordlines (WLs) and/or bitlines (BLs) to access one or more cells from among a memory array of the data storage device. The data storage device compares one or more subsets of the WLs and/or of the BLs to each other to detect for the failure. The data storage device determines the failure is present in the decoding of the x-bit row address and/or the y-bit column of the (x+y)-bit address when one or more WL and/or BL from among the one or more subsets of the WLs and/or the BLs differ.

20 Claims, 9 Drawing Sheets

Related U.S. Application Data continuation of application No. 15/689,497, filed on Aug. 29, 2017, now Pat. No. 10,141,059.

(60) Provisional application No. 62/428,086, filed on Nov. 30, 2016.

(51) Int. Cl.
| | | |
|---|---|---|
| *G11C 29/14* | (2006.01) | |
| *G11C 29/00* | (2006.01) | |
| *G11C 8/08* | (2006.01) | |
| *G11C 8/20* | (2006.01) | |

(56) References Cited

U.S. PATENT DOCUMENTS

| | | |
|---|---|---|
| 6,721,216 B2 | 4/2004 | Mak et al. |
| 7,388,802 B2 | 6/2008 | Wuidart et al. |
| 7,562,256 B2 | 7/2009 | Terao et al. |
| 8,046,655 B2 * | 10/2011 | Dubey ............... G11C 5/025 |
| | | 714/742 |
| 2008/0037338 A1 | 2/2008 | Chen et al. |
| 2014/0133235 A1 | 5/2014 | Kim |
| 2018/0151227 A1 | 5/2018 | Fujiwara et al. |

\* cited by examiner

FAILURE DETECTION CIRCUITRY FOR ADDRESS DECODER FOR A DATA STORAGE DEVICE

CROSS-REFERENCE TO RELATED APPLICATIONS

The present application is a continuation of U.S. patent application Ser. No. 16/160,406, filed Oct. 15, 2018, which is a continuation of U.S. patent application Ser. No. 15/689,497, filed Aug. 29, 2017, now U.S. Pat. No. 10,141,059, which claims the benefit of U.S. Provisional Patent Appl. No. 62/428,086, filed Nov. 30, 2016, each of which is incorporated herein by reference in its entirety.

BACKGROUND

Manufacturers of automobiles are integrating even more computers, or computer systems having multiple computers, including a data storage device into their automobiles. This data storage device can store everything from personal preferences for settings of seat, mirrors, climate control, and headlights to advanced engine control of the automobiles in their memory cells. Often times, this data storage device includes many memory cells that are configured and arranged into an array of memory cells. Each of these memory cells can be accessed by providing an x-bit row address and a y-bit column of an (x+y)-bit address to the data storage device. The data storage device decodes the (x+y)-bit address to provide various wordlines (WLs) and/or bitlines (BLs) to provide access to a memory cell from among the array of memory cells corresponding to the (x+y)-bit address. However in some situations, the data storage devices cannot properly decode the (x+y)-bit address. This failure in the decoding can cause the data storage device to access a different memory cell from among the array of memory cells that does not correspond to the (x+y)-bit address. For example, the failure in the decoding can cause, for example, the data storage device to read and/or write information of the personal preferences into memory cells having the advanced engine control of the automobile. This can lead to a catastrophic failure of the automobile. Fortunately, the International Organization for Standardization (ISO) has prescribed an international standard, namely ISO26262, for functional safety of electrical and/or electronic systems in production automobiles.

BRIEF DESCRIPTION OF THE DRAWINGS/FIGURES

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figure 8:
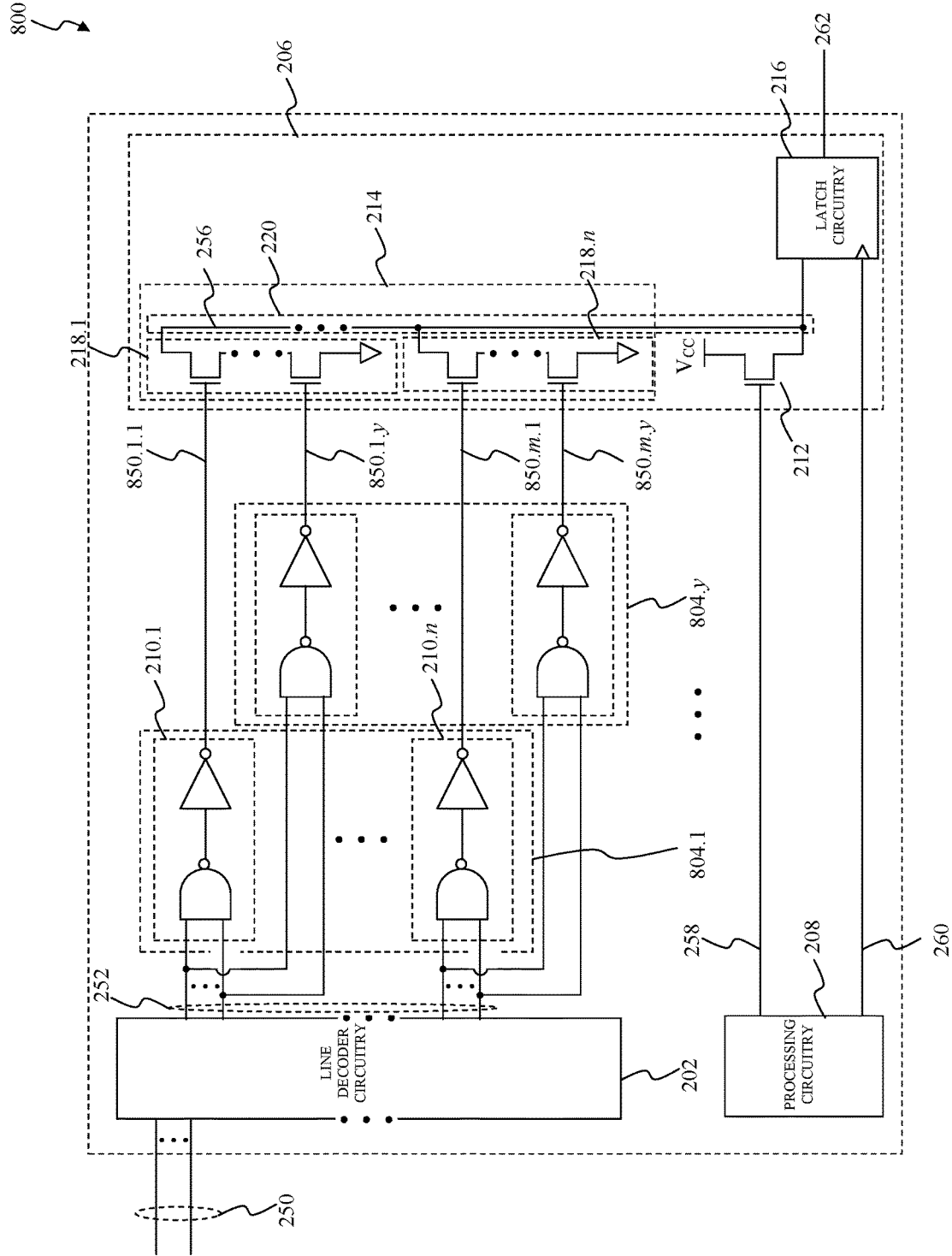
Figure 9:
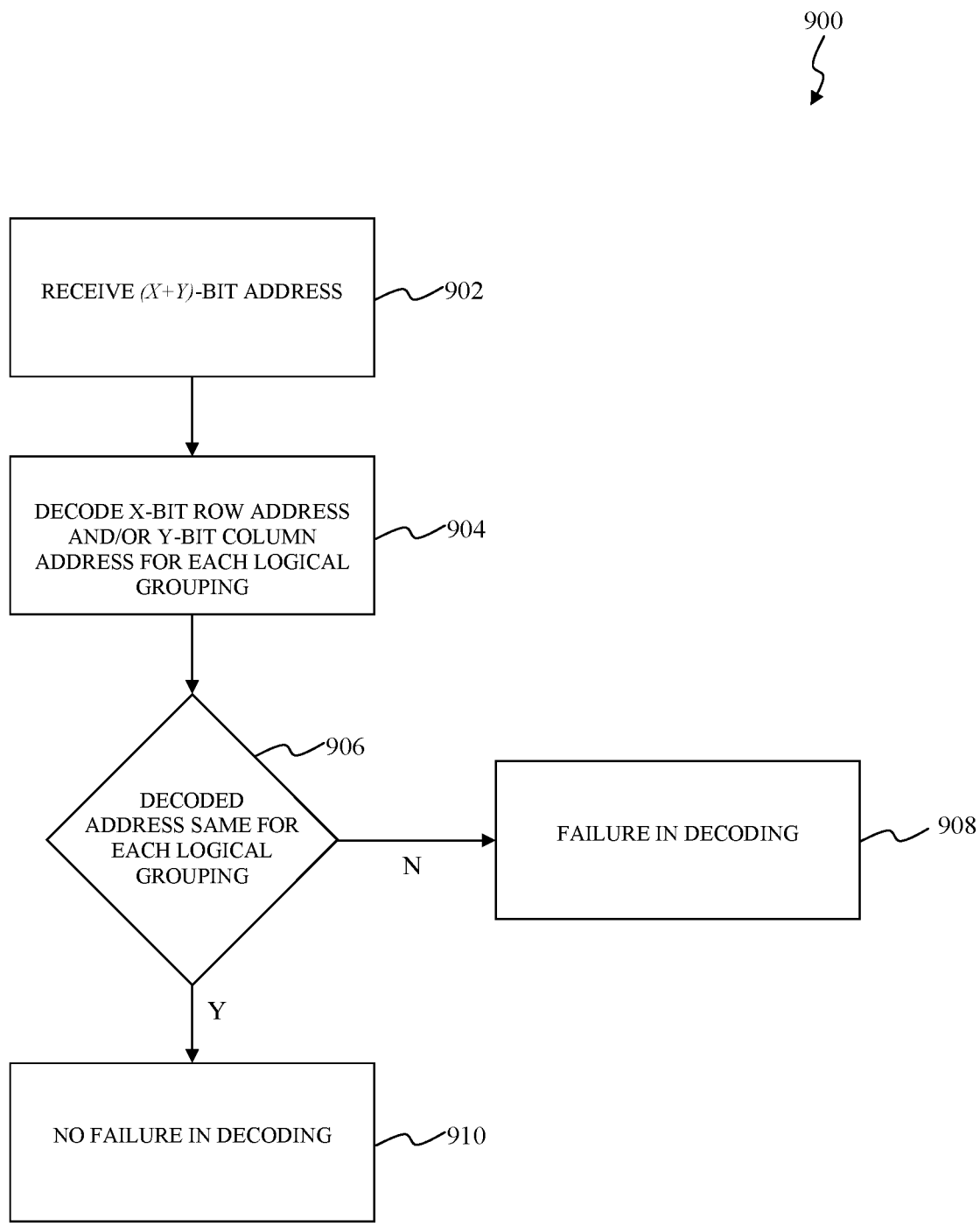

FIG. 8 illustrates a block diagram of an exemplary column decoder that can be implemented as part of the data storage device according to an exemplary embodiment of the present disclosure; and FIG. 9 is a flowchart of an exemplary operational control flow of the row decoder and/or the column decoder that can be implemented as part of the data storage device according to an exemplary embodiment of the present disclosure.

The present disclosure will now be described with reference to the accompanying drawings.

DETAILED DESCRIPTION OF THE DISCLOSURE

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Overview

A data storage device can detect for a failure in decoding of an x-bit row address and/or a y-bit column address of an (x+y)-bit address. The data storage device decodes the x-bit row address and/or the y-bit column address to provide wordlines (WLs) and/or bitlines (BLs) to access one or more cells from among a memory array of the data storage device. The data storage device compares one or more subsets of the WLs and/or of the BLs to each other to detect for the failure. The data storage device determines the failure is present in the decoding of the x-bit row address and/or the y-bit column address of the (x+y)-bit address when one or more WL and/or BL from among the one or more subsets of the WLs and/or the BLs differ.

Exemplary Data Storage Device

Figure 1:
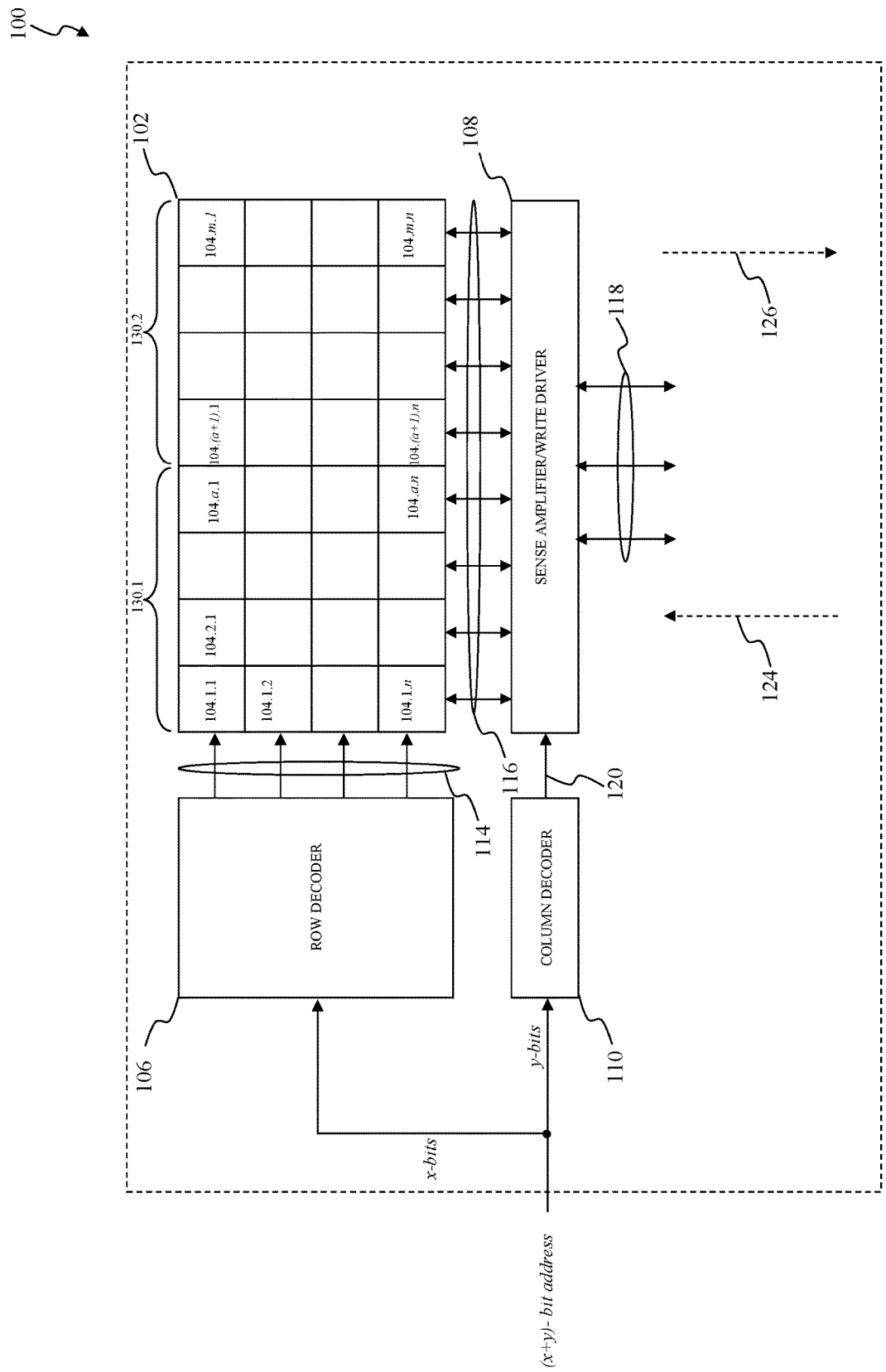
FIG. 1 illustrates a block diagram of a data storage device according to an exemplary embodiment of the present disclosure.

FIG. 1 illustrates a block diagram of a data storage device according to an exemplary embodiment of the present disclosure. A data storage device 100 operates in first direction 124 to write information to one or more memory cells that are configured to form an array of memory cells or in second direction 126 to read information from the one or more memory cells. The writing of the information in the first direction 124 can also be referred to as a write mode of operation and the reading of the information in the second direction 126 can also be referred to as a read mode of operation. In the read mode of operation, the data storage device 100 reads information from one or more memory cells corresponding to an (x+y)-bit address. Similarly, the data storage device 100 writes information to one or more memory cells corresponding to an (x+y)-bit address in the write mode of operation. The data storage device 100 can be implemented as volatile memory, such as random access memory (RAM), which uses power to maintain the information or non-volatile memory, such as read-only memory (ROM), which maintains the information even when not powered. The RAM can be implemented as dynamic random-access memory (DRAM), static random-access memory (SRAM), and/or non-volatile random-access memory (NVRAM), such as flash memory to provide an example. The data storage device 100 includes a memory array 102, a row decoder 106, a sense amplifier/write driver 108, and a column decoder 110.

The memory array 102 includes memory cells 104.1.1 through 104.*m.n* that are arranged in an array of m columns and n rows. However, other arrangements for the memory cells 104.1.1 through 104.*m*.n are possible without departing from the spirit and scope of the present disclosure. Each of the memory cells 104.1.1 through 104.*m*.n is connected to a corresponding WL from among the WLs 114.1 through 114.*n* and a corresponding BL from among the BLs 116.1 through 116.*m*. In an exemplary embodiment, the memory cells 104.1.1 through 104.*m*.n in each of the m columns of the memory array 102 share a common BL from among the BLs 116.1 through 116.*m*. Similarly, the memory cells 104.1.1 through 104.*m*.n in each of n rows of the memory array 102 share a common WL from among the WLs 114.1 through 114.*n*. For example, as shown in FIG. 1, the memory cells 104.1.1 through 104.*m*.1 of row one of the memory array 102 share the WL 114.1 and the memory cells 104.*m*.1 through 104.*m*.n of column m of the memory array 102 share the BL 116.*m*. In some situations, the m columns of the memory array 102 can be logically grouped into multiple memory sub-arrays. For example, as illustrated in the exemplary embodiment of FIG. 1, columns 1 through a of the m columns of the memory array 102 can be logically grouped into a first memory sub-array 130.1 and columns (a+1) through m of the m columns of the memory array 102 can be logically grouped into a second memory sub-array 130.2. However, those skilled in the relevant art(s) will recognize that other logical groupings of the m columns of the memory array 102 are possible without departing from the spirit and scope of the present disclosure.

The row decoder 106 decodes a corresponding x-bit row address from among an (x+y)-bit address and provides one or more control signals as the WLs 114.1 through 114.*n* that correspond to the x-bit row address to select a row of memory cells from among the memory cells 104.1.1 through 104.*m*.n. In an exemplary embodiment, the row decoder 106 can detect for failures in the decoding of the corresponding x-bit row address. For example, as discussed above, the columns 1 through a of the m columns of the memory array 102 can be logically grouped into the first memory sub-array 130.1 and the columns (a+1) through m of the m columns of the memory array 102 can be logically grouped into a second memory sub-array 130.2. In this example, the row decoder 106 can include a first group of parallel address decoders corresponding to the n rows of the first memory sub-array 130.1 and second group of parallel address decoders corresponding to the n rows of the second memory sub-array 130.2. Because the n rows of the first memory sub-array 130.1 and the n rows of the second memory sub-array 130.2 share common WLs from among the WLs 114.1 through 114.*n*, outputs of the first group of address decoders should match to outputs of the second group of address decoders. As such, the row decoder 106 can compare the outputs of the first group of address decoders to their corresponding outputs of the second group of address decoders to determine whether failures are present in the decoding of the corresponding x-bit row address. Typically, failures are present in the decoding of the corresponding x-bit row address when differences between the outputs of the first group of address decoders and their corresponding outputs of the second group of address decoders are present.

The column decoder 110 decodes a corresponding y-bit column address from among the (x+y)-bit address and provides one or more control signals 120 to sense the amplifier/write driver 108 that correspond to the y-bit column address. The sense amplifier/write driver 108 selects a column of memory cells from among the memory cells 104.1.1 through 104.*m*.n that corresponds to the y-bit column address. The sense amplifier/write driver 108, using a sense amplifier, reads the information from a corresponding one or more BLs from among the BLs 116.1 through 116.*m* that corresponds to a selected one or more memory cells from among the memory cells 104.1.1 through 104.*m*.n during the read mode operation to provide information 118. Alternatively, the sense amplifier/write driver 108, using a write driver, receives the information 118 and writes the K information 118 to corresponding BLs from among the BLs 116.1 through 116.*m* that corresponds to a selected memory cell from among the memory cells 104.1.1 through 104.*m*.n during the write mode of operation.

Figure 2:
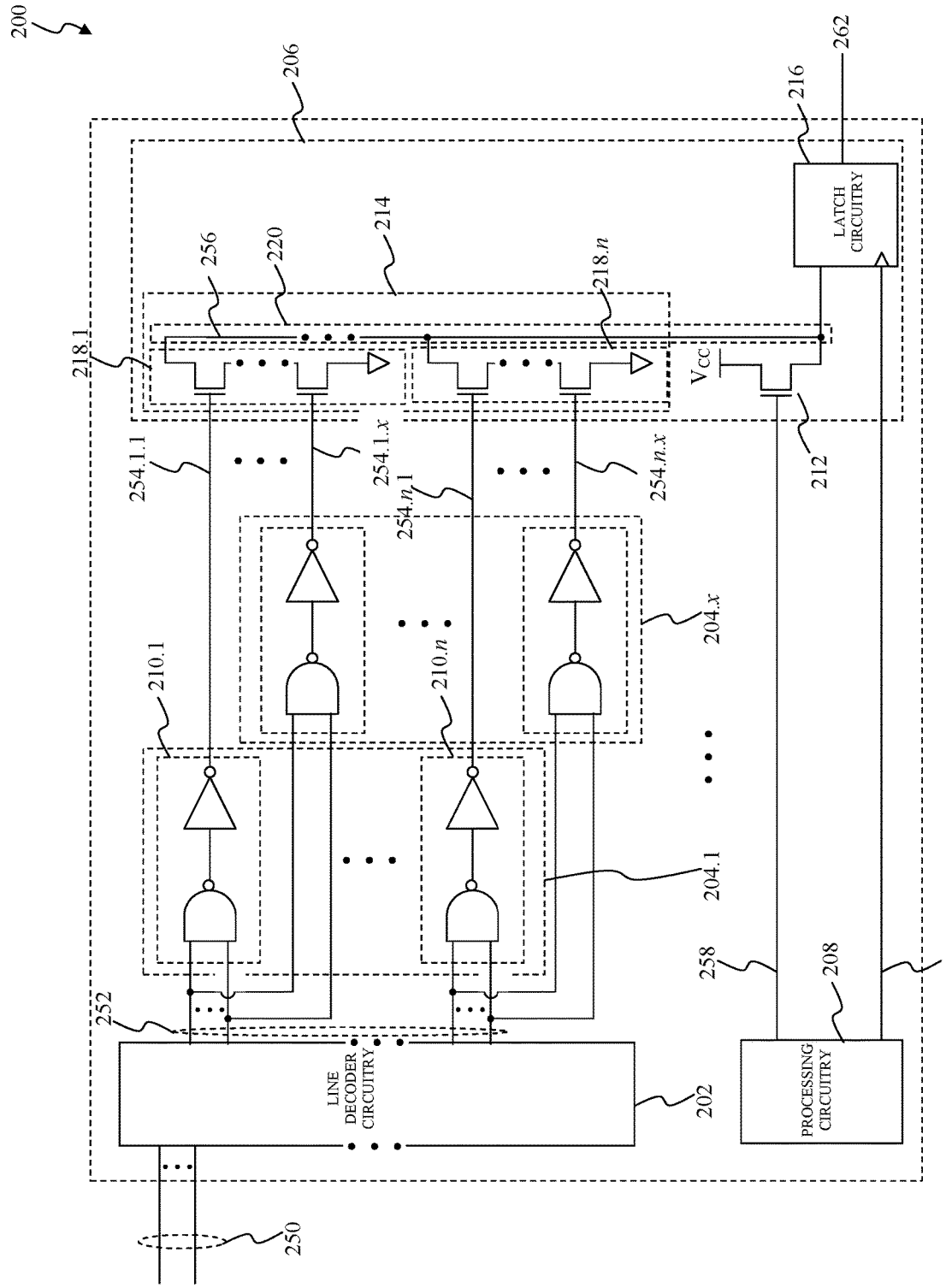
FIG. 2 illustrates a block diagram of an exemplary row decoder that can be implemented as part of the data storage device according to an exemplary embodiment of the present disclosure.

An Exemplary Row Decoder that can be Implemented as Part of the Data Storage Device FIG. 2 illustrates a block diagram of an exemplary row decoder that can be implemented as part of the data storage device according to an exemplary embodiment of the present disclosure. A row decoder 200 can represent an exemplary embodiment of the row decoder 106 as illustrated in FIG. 1. The row decoder 200 decodes a row address, such as the corresponding x-bit row address from the (x+y)-bit address to provide an example, to provide WLs, such as the WLs 114.1 through 114.*n* to provide an example, which correspond to the x-bit row address. The row decoder 200 can detect for failures in the decoding of the corresponding x-bit row address. As illustrated in FIG. 2, the row decoder 200 includes line decoder circuitry 202, parallel address decoders 204.1 through 204.*x*, failure detection circuitry 206, and processing circuitry 208.

The line decoder circuitry 202 decodes inputs bits 250 corresponding to the row address to provide output bits 252. The line decoder circuitry 202 activates various output bits 252 for each combination of the inputs bits 250. For example, each row of a memory array of a data storage device having five hundred twelve rows can be accessed by a unique combination of nine input bits. In this example, the line decoder circuitry 202 decodes the unique combination of nine input bits to provide a unique combination of five hundred twelve output bits to access a row from among the five hundred twelve rows corresponding to the unique combination of nine input bits.

The parallel address decoders 204.1 through 204.x decode the output bits 252 to provide complementary WLs 254.1.1 through 254.n.x. In an exemplary embodiment, the subscript "n" corresponds to one of the n rows of a memory array and the subscript "x" corresponds to one of x-bits of the x-bit row address as described above in FIG. 1. As illustrated in FIG. 2, the parallel address decoder 204.1 provides the complementary WLs 254.1.1 through 254.n.1 and the parallel address decoder 204.x provides the complementary WLs 254.1.x through 254.n.x. The complementary WLs 254.1.1 through 254.n.1 correspond to WLs 1 through n of a first memory sub-array, such as the first memory sub-array 130.1 to provide an example, which is associated with the parallel address decoder 204.1 from among multiple memory sub-arrays. Similarly, the complementary WLs 254.1.x through 254.n.x correspond to WLs 1 through n of a $x^{th}$ memory sub-array, such as the second memory sub-array 130.2 to provide an example, which is associated with the parallel address decoder 204.x from among the multiple memory sub-arrays. The complementary WLs 254.1.1 through 254.n.x can represent an exemplary embodiment of the WLs 114.1 through 114.n. For example, the complementary WLs 254.1.1 through 254.n.1 and the complementary WLs 254.x.1 through 254.n.x can represent exemplary embodiments of the WLs 114.1 and 114.n, respectively.

In the exemplary embodiment illustrated in FIG. 2, the parallel address decoders 204.1 through 204.x can be implemented in substantially similar manner to each other; therefore, only the parallel address decoder 204.1 is to be discussed in further detail below. The parallel address decoder 204.1 includes logic circuitry 210.1 through 210.n. The logic circuitry 210.1 through 210.n performs one or more logical operations on the output bits 252 to provide the complementary WLs 254.1.1 through 254.n.1. The one or more logical operations can be implemented using logical NAND gates and logical inverting gates as illustrated in FIG. 2; however, those skilled in the relevant art(s) will recognize that other logical gates may be used to implement the one or more logical operations that will be apparent to those skilled in the relevant art(s) without departing from the spirit and scope of the present disclosure. Because each row of the multiple memory sub-arrays shares common WLs, an output of a logic circuitry 210.1 of a first parallel address decoder from among the parallel address decoders 204.1 through 204.x of address decoders should match to an output of the logic circuitry 210.1 of a second parallel address decoder from among the parallel address decoders 204.1 through 204.x. As such, the failure detection circuitry 206 can compare the outputs of the first parallel address decoder to their corresponding outputs of the second parallel address decoder to determine whether failures are present in the decoding of the corresponding x-bit row address. Typically, failures are present in the decoding of the corresponding x-bit row address when differences between the outputs of the first parallel address decoder and their corresponding outputs of the second parallel address decoder are present.

The failure detection circuitry 206 can detect for failures in the decoding of the output bits 252 by the parallel address decoders 204.1 through 204.x. As illustrated in FIG. 2, the complementary WLs 254.1.1 through 254.n.1 correspond to a first row of memory cells of the memory array of the data storage device and the complementary WLs 254.1.x through 254.n.x correspond to a $b^{th}$ row of memory cells of the memory array of the data storage device. As such, the failure detection circuitry 206 can compare the complementary WLs 254.1.1 through 254.1.x to each other and/or the complementary WLs 254.n.1 through 254.n.x to each other to determine whether failures are present in the decoding of the output bits 252 by the parallel address decoders 204.1 through 204.x.

In the exemplary embodiment illustrated in FIG. 2, the failure detection circuitry 206 includes pre-charging circuitry 212, comparison circuitry 214, and latch circuitry 216. The pre-charging circuitry 212 charges a failure indication line 256 to approximately a charging voltage, such as a supply voltage $V_{CC}$ to provide an example, in response to a failure enable control signal 258. The processing circuitry 208 can provide the failure enable control signal 258. As illustrated in FIG. 2, the pre-charging circuitry 212 includes an n-type transistor that charges the failure indication line 256 to the charging voltage when activated, namely, when at the failure enable control signal 258 is at a first logical level, such as a logical one to provide an example.

The comparison circuitry 214 indicates no failures have occurred in the decoding of the output bits 252 by the parallel address decoders 204.1 through 204.x by discharging the failure indication line 256 to less than the charging voltage. However, when the failure indication line 256 remains charged, namely, at approximately the charging voltage, failures in the decoding of the output bits 252 by the parallel address decoders 204.1 through 204.x have occurred. In the exemplary embodiment illustrated in FIG. 2, the comparison circuitry 214 is implemented as a dynamic logical AND-NOR gate. However, those skilled in the relevant art(s) will recognize that the comparison circuitry 214 can be implemented using other logical gates or other combinations of logical gates to implement a substantially similar function as the dynamic logical AND-NOR gate without departing from the spirit and scope of the present disclosure. As illustrated in FIG. 2, the logic circuitry 210.1 through 210.n of each of the parallel address decoders 204.1 through 204.x are coupled to a corresponding logical AND gate from among logical AND gates 218.1 through 218.n. Thereafter, the logical AND gates 218.1 through 218.n are coupled to each other to form a logical NOR 220 gate as illustrated in FIG. 2.

During operation, failure detection circuitry 206 can detect for the failures in the decoding of the output bits 252 by the parallel address decoders 204.1 through 204.x through charging and/or discharging the failure indication line 256. Specifically, the logical AND gates 218.1 through 218.n compare groups of complementary WLs, such as the complementary WLs 254.1.1 through 254.1.x or the complementary WLs 254.n.1 through 254.n.x to provide some examples, from among complementary WLs 254.1.1 through 254.n.x. For example, each row of a memory array of a data storage device having five hundred twelve rows can be accessed by a unique combination of nine input bits. In this example, the logical AND gates 218.1 through 218.512 compare groups of complementary WLs, such as the complementary WLs 254.1.1 through 254.1.9 or the complementary WLs 254.512.1 through 254.512.9 to provide some examples, from among complementary WLs 254.1.1 through 254.512.9. The logical AND gates 218.1 through 218.n are in a conductive mode of operation when their respective inputs are at the first logical level, such as a logical one to provide an example, and a non-conductive mode of operation when their respective inputs are at a second logical level, such as a logical zero to provide an example. When in the conductive mode of operation, the logical AND gates 218.1 through 218.n couple the failure indication line 256 to a ground voltage thereby discharging the failure indication line 256. However, the logical AND gates 218.1 through 218.n do not couple the failure indication line 256 to the ground voltage in the non-conductive mode of operation which causes the failure indication line 256 to remain charged, namely at approximately the charging voltage. In an exemplary embodiment, a group of complementary WLs corresponding to a row of the memory array of the data storage device from among the complementary WLs 254.1.x through 254.n.x is at the first logical level, such as the logical one to provide an example, and remaining groups of the complementary WLs are at the second logical level, such as the logical zero to provide an example, to access the row of the memory array of the data storage device. In this exemplary embodiment, a logical AND gate corresponding to the group of complementary WLs at the first logical level is in the conductive mode of operation, thereby discharging the failure indication line 256 to be less than the charging voltage. However, if a parallel address decoder corresponding to the group of complementary WLs from among the parallel address decoders 204.1 through 204.x does not properly decode the output bits 252, a complementary WL corresponding to this parallel address decoder from among the group of complementary WLs is at the second logical level instead of the first logical level. In this situation, a failure has occurred in the decoding of the output bits 252 by the parallel address decoder. As a result of this failure, the logical AND gate corresponding to the group of complementary WLs is in the non-conductive mode of operation which causes the failure indication line 256 to remain charged, namely be at approximately the charging voltage.

The logical NOR 220 gate passes a state of the failure indication line 256, namely whether the failure indication line 256 is charged to approximately the charging voltage or discharged to be less than the charging voltage, onto the latch circuitry 216. The latch circuitry 216 samples the failure indication line 256 at one or more instances in time and latches the state of the failure indication line 256 in response to a failure clocking control signal 260. The processing circuitry 208 can provide the failure clocking control signal 260. The latch circuitry 216 can provide, in response to the failure clocking control signal 260, the first logical level, such as the logical one, as a failure indicator 262 when the failure indication line 256 is at approximately the charging voltage, namely charged, which indicates failures have occurred in the decoding of the output bits 252 by the parallel address decoders 204.1 through 204.x. Otherwise, the latch circuitry 216 can provide, in response to the failure clocking control signal 260, the second logical level, such as the logical zero, as the failure indicator 262 when the failure indication line 256 is less than the charging voltage, namely discharged, which indicates no failures have occurred in the decoding of the output bits 252 by the parallel address decoders 204.1 through 204.x.

Figure 3:
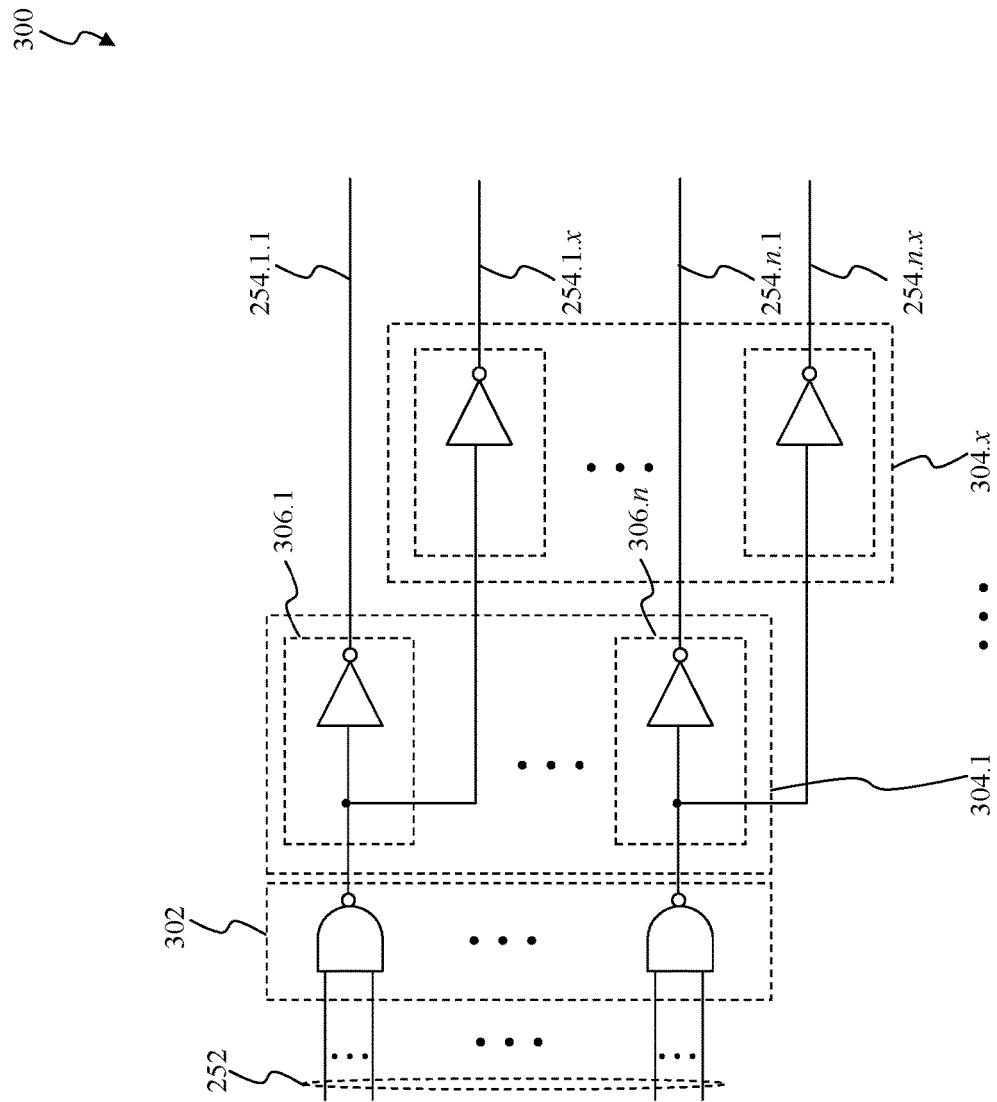
FIG. 3 illustrates a block diagram of an exemplary alternate parallel address decoder that can be implemented as part of the row decoder according to an exemplary embodiment of the present disclosure.

An Exemplary Alternate Parallel Address Decoder that can be Implemented as Part of the Exemplary Row Decoder FIG. 3 illustrates a block diagram of an exemplary alternate parallel address decoder that can be implemented as part of the row decoder according to an exemplary embodiment of the present disclosure. A parallel address decoder 300 decodes the output bits 252 to provide the complementary WLs 254.1.1 through 254.n.x. As illustrated in FIG. 3, the parallel address decoder 300 includes a common address decoder 302 and parallel address decoders 304.1 through 304.x. The common address decoder 302 and the parallel address decoders 304.1 through 304.x can represent an exemplary alternative to the parallel address decoders 204.1 through 204.x as illustrated in FIG. 2.

The common address decoder 302 performs one or more first logical operations on the output bits 252. The one or more first logical operations can be implemented using logical NAND gates as illustrated in FIG. 3; however, those skilled in the relevant art(s) will recognize that other logical gates may be used to implement the one or more first logical operations that will be apparent to those skilled in the relevant art(s) without departing from the spirit and scope of the present disclosure.

The parallel address decoders 304.1 through 304.x perform one or more second logical operations on outputs of the common address decoder 302 to provide the complementary WLs 254.1.1 through 254.n.x. The one or more second logical operations can be implemented using logical inverting gates as illustrated in FIG. 3; however, those skilled in the relevant art(s) will recognize that other logical gates may be used to implement the one or more second logical operations that will be apparent to those skilled in the relevant art(s) without departing from the spirit and scope of the present disclosure.

Figure 4:
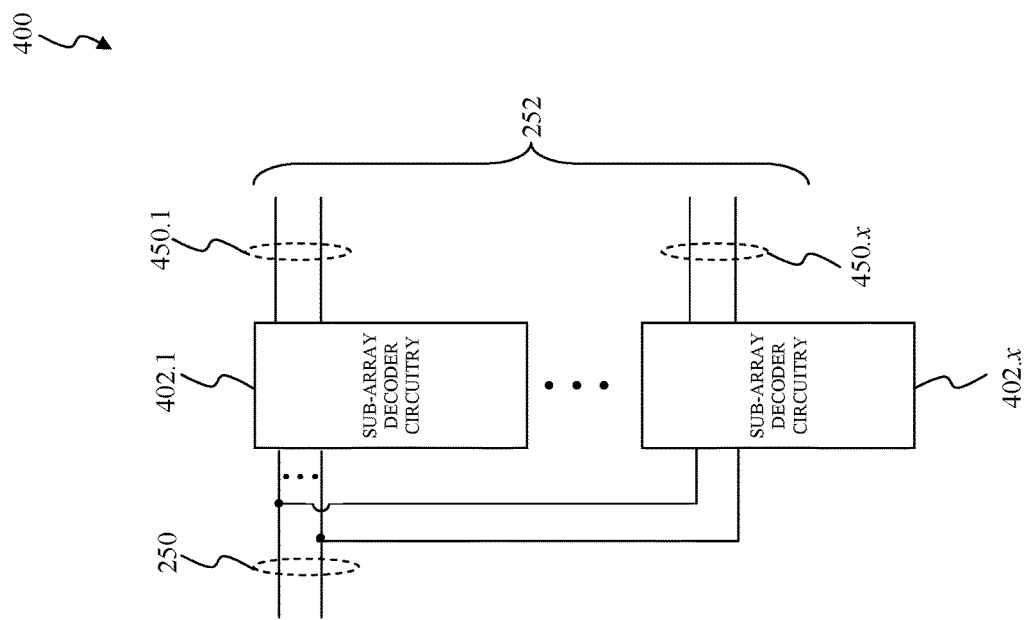
FIG. 4 illustrates a block diagram of an exemplary alternate line decoder circuitry that can be implemented as part of the row decoder according to an exemplary embodiment of the present disclosure.

An Exemplary Alternate Line Decoder Circuitry that can be Implemented as Part of the Exemplary Row Decoder FIG. 4 illustrates a block diagram of an exemplary alternate line decoder circuitry that can be implemented as part of the row decoder according to an exemplary embodiment of the present disclosure. Line decoder circuitry 400 decodes the inputs bits 250 corresponding to the row address to provide the output bits 252. The line decoder circuitry 400 includes sub-array decoder circuits 402.1 through 402.x. The line decoder circuitry 400 can represent an exemplary alternative to the line decoder circuitry 202 as illustrated in FIG. 2.

The sub-array decoder circuits 402.1 through 402.x provide various combinations for their corresponding output bits 450.1 through 450.x for each combination of the inputs bits 250. The output bits 450.1 through 450.x can represent an exemplary embodiment of the output bits 252. As illustrated in FIG. 4, the sub-array decoder circuit 402.1 provides various combinations for the output bits 450.1 for each combination of the inputs bits 250 and the sub-array decoder circuit 402.x provides various combinations for the output bits 450.x for each combination of the inputs bits 250. In an exemplary embodiment, each of the sub-array decoder circuits 402.1 through 402.x are implemented in a substantially similar manner to each other; however, those skilled in the relevant art(s) will recognize that one or more of the sub-array decoder circuits 402.1 through 402.x can be implemented differently from one another without departing from the spirit and scope of the present disclosure. In another exemplary embodiment, the sub-array decoder circuit 402.1 corresponds to a first memory sub-array, such as the first memory sub-array 130.1 to provide an example, which is associated with the parallel address decoder 204.1 as illustrated in FIG. 2. Similarly, the sub-array decoder circuit 402.x corresponds to a $b^{th}$ memory sub-array, such as the second memory sub-array 130.2 to provide an example, which is associated with the parallel address decoder 204.x as illustrated in FIG. 2.

Figure 5:
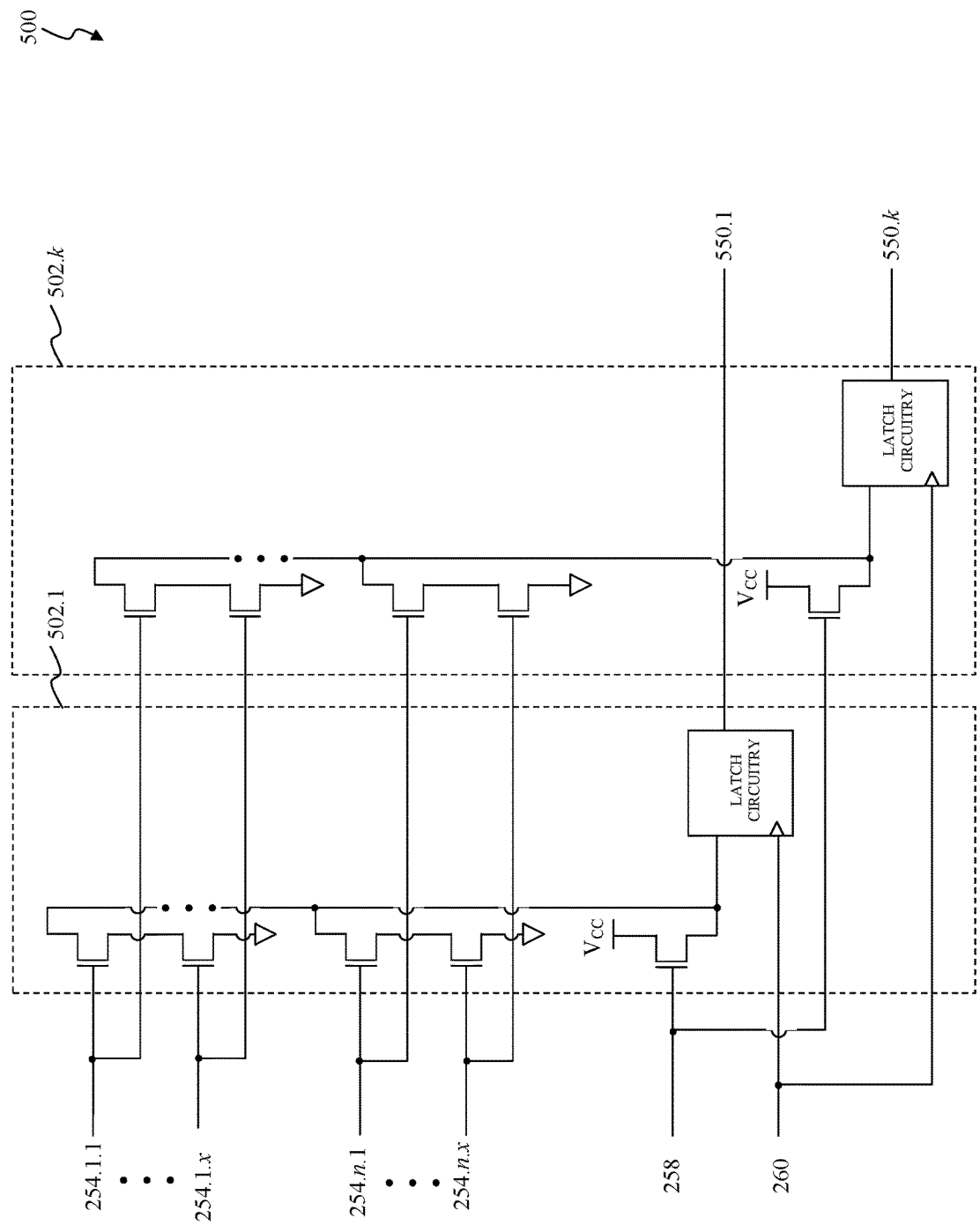
FIG. 5 illustrates a block diagram of a first exemplary alternate line decoder circuitry that can be implemented as part of the row decoder according to an exemplary embodiment of the present disclosure.

A First Exemplary Alternate Failure Detection Circuitry that can be Implemented as Part of the Exemplary Row Decoder FIG. 5 illustrates a block diagram of a first exemplary alternate line decoder circuitry that can be implemented as part of the row decoder according to an exemplary embodiment of the present disclosure. Failure detection circuit 500 can detect for failures in the decoding of the output bits 252 by the parallel address decoders 204.1 through 204.x. The failure detection circuit 500 includes failure detection circuitry 502.1 through 502.k. The failure detection circuit 500 can represent an exemplary alternative to the failure detection circuit 206 as illustrated in FIG. 2.

As illustrated in FIG. 5, the failure detection circuitry 502.1 through 502.k can detect for failures in the decoding of the output bits 252 by the parallel address decoders 204.1 through 204.x. In an exemplary embodiment, the failure detection circuitry 502.1 through 502.k are implemented in a substantially similar manner to each other, such as in a substantially similar manner as the failure detection circuitry 206 as illustrated in FIG. 2 to provide an example. In this exemplary embodiment, each of the failure detection circuitry 502.1 through 502.k operates in a substantially similar manner as the failure detection circuitry 206 as illustrated in FIG. 2. The failure detection circuitry 502.1 through 502.k can compare the complementary WLs 254.1.1 through 254.1.x to each other and/or the complementary WLs 254.n.1 through 254.n.x to each other to determine whether failures are present in the decoding of the output bits 252 by the parallel address decoders 204.1 through 204.x. In the exemplary embodiment illustrated in FIG. 5, the failure detection circuitry 502.1 through 502.k can provide the first logical level, such as the logical one, as a corresponding failure indicator from among the failure indicators 552.1 through 552.k to indicate failures have occurred in the decoding of the output bits 252 by the parallel address decoders 204.1 through 204.x. Otherwise, the failure detection circuitry 502.1 through 502.k can provide the second logical level, such as the logical zero, as the corresponding failure indicator from among the failure indicators 552.1 through 552.k to indicate no failures have occurred in the decoding of the output bits 252 by the parallel address decoders 204.1 through 204.x.

Figure 6:
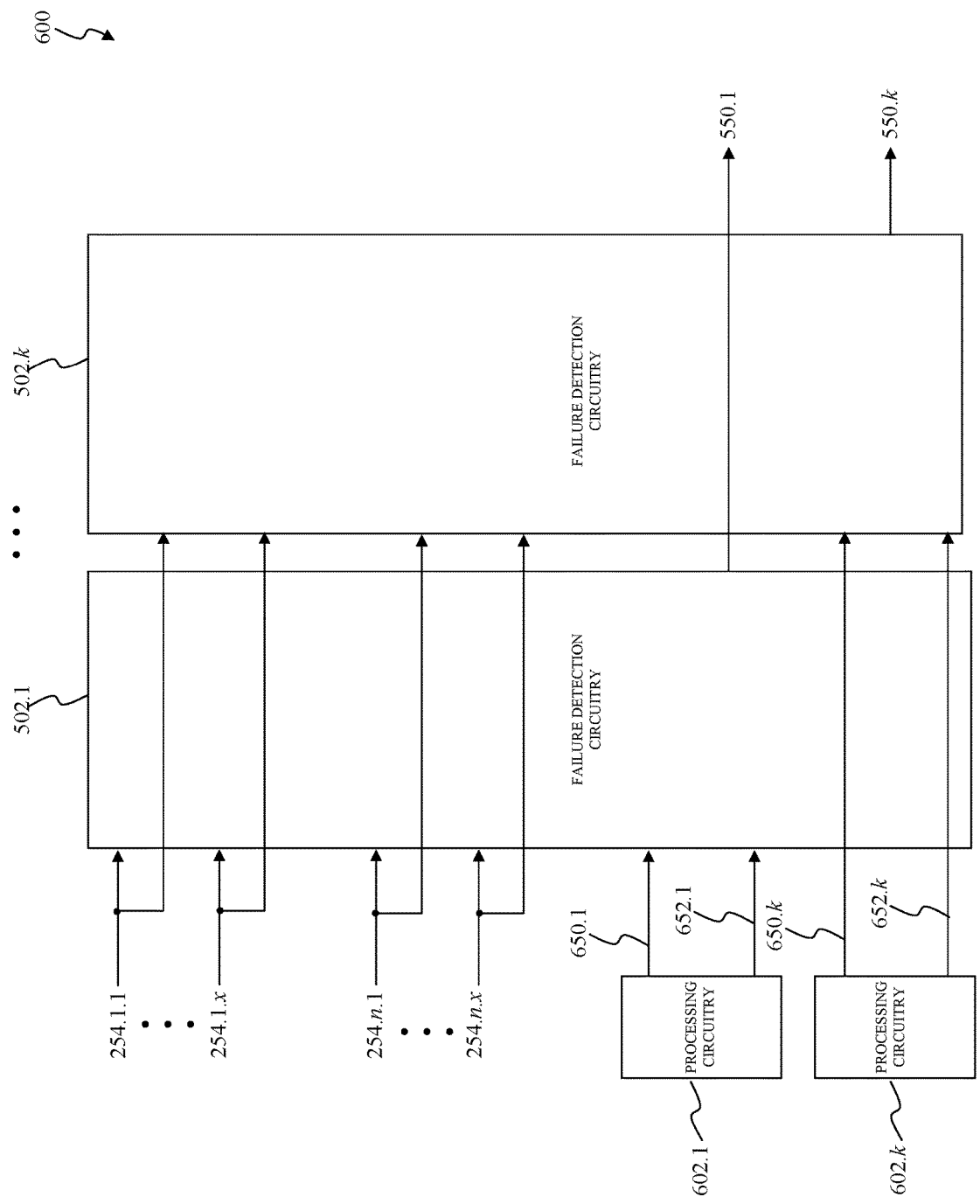
FIG. 6 illustrates a block diagram of an exemplary alternate processing circuitry that can be implemented with the alternate line decoder circuitry according to an exemplary embodiment of the present disclosure.

Exemplary Alternate Processing Circuitry that can be Implemented with the Exemplary Failure Detection Circuitry FIG. 6 illustrates a block diagram of an exemplary alternate processing circuitry that can be implemented with the alternate line decoder circuitry according to an exemplary embodiment of the present disclosure. As illustrated in FIG. 6, processing circuitry 600 can provide failure enable control signals 650.1 through 650.k and failure clocking control signals 652.1 through 652.k to corresponding failure detection circuitry from among the failure detection circuitry 502.1 through 502.k. In the exemplary embodiment illustrated in FIG. 6, each of the failure clocking control signals 652.2 through 652.k operates in a substantially manner as the failure enable control signal 258 as discussed in FIG. 2 and each of the failure clocking control signals 652.1 through 652.k operates in a substantially manner as the failure clocking control signal 260 as discussed in FIG. 2. The processing circuitry 600 can represent an exemplary alternative to the processing circuitry 208 as illustrated in FIG. 2.

Figure 7:
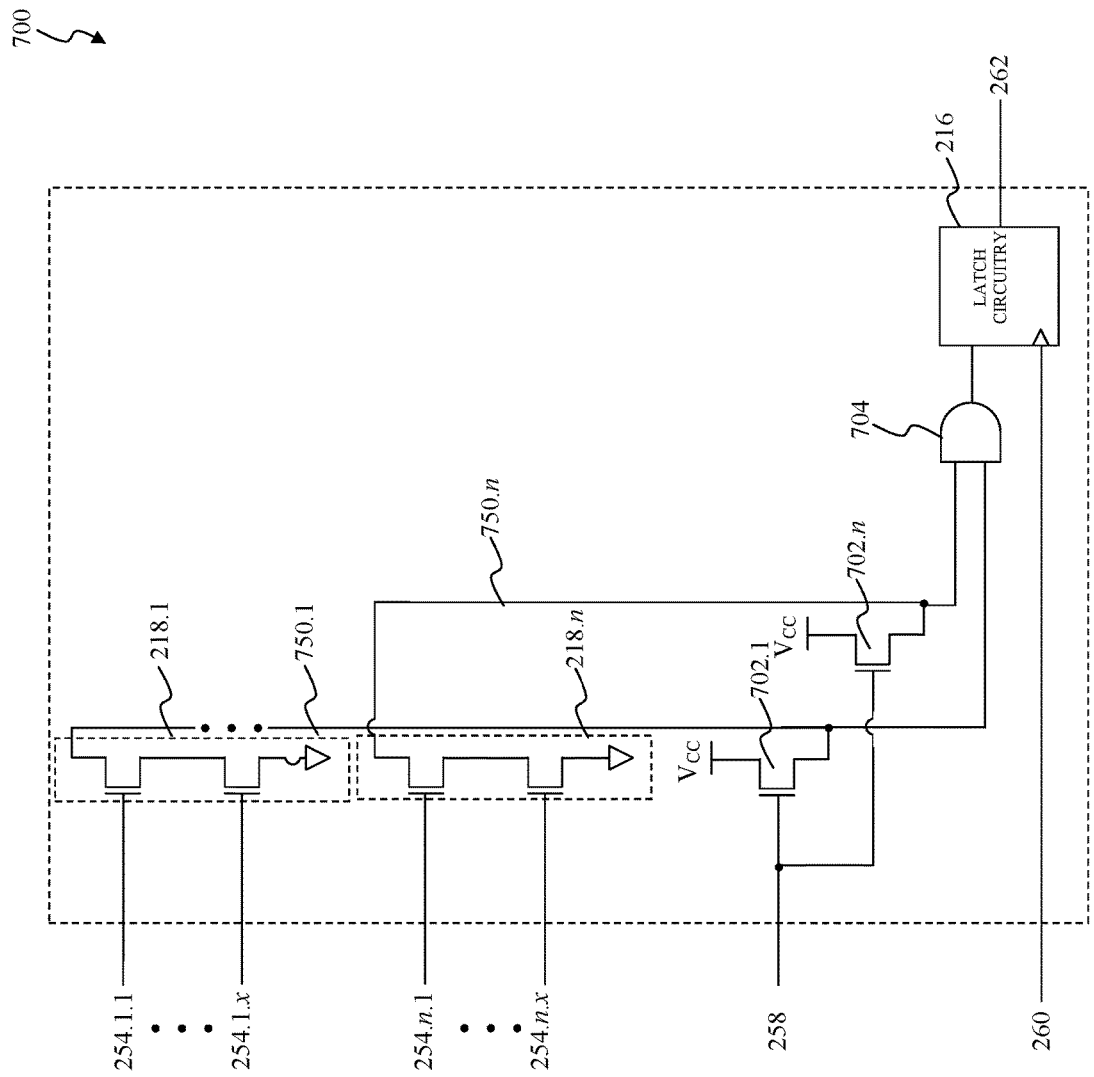
FIG. 7 illustrates a block diagram of a second exemplary alternate line decoder circuitry that can be implemented as part of the row decoder according to an exemplary embodiment of the present disclosure.

A Second Exemplary Alternate Failure Detection Circuitry that can be Implemented as Part of the Exemplary Row Decoder FIG. 7 illustrates a block diagram of a second exemplary alternate line decoder circuitry that can be implemented as part of the row decoder according to an exemplary embodiment of the present disclosure. Failure detection circuitry 700 can detect for failures in the decoding of the output bits 252 by the parallel address decoders 204.1 through 204.x. As illustrated in FIG. 7, the failure detection circuitry 700 includes the latch circuitry 216, the logical AND gates 218.1 through 218.n, pre-charging circuitry 702.1 through 702.n, and a logical AND gate 704. The failure detection circuitry 700 can represent an exemplary alternative to the failure detection circuitry 206 as illustrated in FIG. 2.

As illustrated in FIG. 7, the pre-charging circuitry 702.1 through 702.n charges failure indication lines 750.1 through 750.n to approximately a charging voltage, such as a supply voltage $V_{CC}$ to provide an example, in response to the failure enable control signal 258. In the exemplary embodiment as illustrated in FIG. 7, each of the pre-charging circuitry 702.1 through 702.n is associated with a corresponding logical AND gate from among the logical AND gates 218.1 through 218.n. In an exemplary embodiment, each of the pre-charging circuitry 702.1 through 702.n includes an n-type transistor that charges its corresponding failure indication line from among the failure indication lines 750.1 through 750.n to the charging voltage when activated, namely, when at the failure enable control signal 258 is at a first logical level, such as a logical one to provide an example.

An Exemplary Column Decoder that can be Implemented as Part of the Data Storage Device FIG. 8 illustrates a block diagram of an exemplary column decoder that can be implemented as part of the data storage device according to an exemplary embodiment of the present disclosure. A column decoder 800 decodes a column address, such as the corresponding y-bit column address from the (x+y)-bit address to provide an example, to provide BLs, such as the BLs 116.1 through 116.m to provide an example, which correspond to the y-bit column address. The column decoder 800 can detect for failures in the decoding of the corresponding y-bit column address in a substantially similar manner as the row decoder 200 can detect for failures in the decoding of the corresponding x-bit row address. As illustrated in FIG. 8, the column decoder 800 includes the line decoder circuitry 202, the parallel address decoders 804.1 through 804.y, the failure detection circuitry 206, and the processing circuitry 208. The column decoder 800 can represent an exemplary embodiment of the column decoder 110 as illustrated in FIG. 1.

The column decoder 800 operates in a substantially similar manner as the row decoder 200 as illustrated in FIG. 2; however, the parallel address decoders 804.1 through 804.y decode the output bits 252 to provide complementary BLs 850.1.1 through 850.m.y. It should be noted that the subscript of "n" as illustrated in FIG. 2 which is associated with the n rows of a memory array, such as the memory array 102 to provide an example, is replaced with "m" as illustrated in FIG. 8 which is associated with the m columns of the memory array and the subscript of "x" as illustrated in FIG. 2 which is associated with the x-bit row address is replaced with "y" as illustrated in FIG. 8 which is associated with the y-bit column address. Furthermore, it will be apparent to those skilled in the relevant art(s) that the column decoder 800 can be implemented using any of the alternates as discussed in FIG. 3 through FIG. 7 in a substantially similar manner as the row decoder 200 without departing from the spirit and scope of the present disclosure.

As illustrated in FIG. 8, the parallel address decoder 204.1 provides the complementary BLs 850.1.1 through 850.m.1 and the parallel address decoder 204.y provides the complementary BLs 850.1.y through 850.m.y. The complementary BLs 850.1.1 through 850.m.1 correspond to BLs 1 through m of a first logical grouping of one or more sense amplifiers/write drivers, such as the sense amplifier/write driver 108 to provide an example. Similarly, the complementary BLs 850.1.y through 850.m.y correspond to BLs 1 through m of an $m^{th}$ logical grouping of one or more sense amplifiers/write drivers, such as the sense amplifier/write driver 108 to provide an example. The complementary BLs 850.1.1 through 850.m.y can represent an exemplary embodiment of the BLs 116.1 through 116.m. For example, the complementary BLs 850.1.1 through 850.m.1 and the complementary BLs 850.y.1 through 850.m.y can represent exemplary embodiments of the BLs 116.1 through 116.m, respectively.

Exemplary Operation of the Row Decoder and/or the Column Decoder that can be Implemented as Part of the Data Storage Device FIG. 9 is a flowchart of an exemplary operational control flow of the row decoder and/or the column decoder that can be implemented as part of the data storage device according to an exemplary embodiment of the present disclosure. The disclosure is not limited to this operational control flow. Rather, it will be apparent to those skilled in the relevant art(s) that other operational control flows are within the scope and spirit of the present disclosure. The following discussion describes an exemplary operational control flow 900 of a row decoder, such as the row decoder 200 to provide an example, and/or of a column decoder, such as the column decoder 800 to provide an example.

At step 902, the operational control flow 900 receives an (x+y)-bit address to access a memory cell from among a memory array of a data storage device, such as one or more of the memory cells 104.1.1 through 104.m.n from among the memory array 102 of the data storage device 100 to provide an example. The (x+y)-bit address includes an x-bit row address to access one or more of n rows of the memory array and a y-bit column address to access one or more of m columns of the memory array.

At step 904, the operational control flow 900 decodes the x-bit row address to provide one or more WLs, such as one or more of the complementary WLs 254.1.1 through 254.1.x to provide an example, and/or the y-bit column address to provide one or more BLs, such as one or more of the complementary BLs 850.1.1 through 850.m.1 to provide an example. For example, the operational control flow 900 can use the line decoder circuitry 202 and the parallel address decoders 204.1 through 204.x as shown in FIG. 2 or any of the alternates as discussed in FIG. 3 through FIG. 7 to decode the x-bit row address. In an exemplary embodiment, the m columns of the memory array can be logically grouped into one or more memory sub-arrays, such as the first memory sub-array 130.1 and the second memory sub-array 130.2 to provide an example. Similarly in this exemplary embodiment, one or more sense amplifiers/write drivers, such as the sense amplifier/write driver 108 to provide an example, can be logically grouped into one or more sub-sense amplifiers/sub-write drivers. In this exemplary embodiment, the one or more WLs for each column of the one or more memory sub-arrays corresponds to one another and the one or more BLs for each row of the one or more sub-sense amplifiers/sub-write drivers corresponds to one another.

At step 906, the operational control flow 900 determines whether the decoded x-bit row address is the same for each column of the one or more memory sub-arrays and/or the decoded y-bit row address is the same for each row of the one or more sub-sense amplifiers/sub-write drivers. For example, the operational control flow 900 can use the failure detection circuitry 206, and the processing circuitry 208 as described in FIG. 2 to determine whether the decoded x-bit row address is the same for each column of the one or more memory sub-arrays and/or the decoded y-bit row address is the same for each row of the one or more sub-sense amplifiers/sub-write drivers. The operational control flow 900 proceeds to step 908 when the decoded x-bit row address is the same for each column of the one or more memory sub-arrays and/or the decoded y-bit column address is the same for each row of the one or more sub-sense amplifiers/sub-write drivers. Otherwise, the operational control flow proceeds to step 910 one or more of the decoded x-bit row addresses and/or one or more of the decoded y-bit column addresses differ.

At step 908, the operational control flow 900 determines that a failure has occurred in the decoding of the x-bit row address and/or the y-bit column address.

At step 910, the operational control flow 900 determines that no failure has occurred in the decoding of the x-bit row address and/or the y-bit column address.

CONCLUSION

The Detailed Description described a data storage device. The data storage device includes a memory array including memory cells and a decoder. The memory array is logically grouped into a first memory sub-array and a second memory sub-array, respectively, from among memory sub-arrays. The data storage device also includes a decoder. The decoder decodes an address to access a memory cell from among the memory cells to provide control signals corresponding to the address, a first control signal and a second control signal from among the control signals being associated with the first memory sub-array and the second memory sub-array, respectively. The decoder also indicates a failure in the decoding of the address when the first control signal differs from the second control signal.

The Detailed Description described method for operating a data storage device having a memory array including memory cells that are logically grouped into memory sub-arrays. The method includes decoding an address to access a memory cell from among the memory cells to provide a control signals corresponding to the address, a first control signal and a second control signal from among the control signals being associated with the first memory sub-array and the second memory sub-array, respectively. The method also includes indicating a failure in the decoding of the address when the first control signal differs from the second control signal.

The Detailed Description described a decoder for decoding a address within an address to access a memory cell from among memory cells in a memory array to provide control signals corresponding to the address, the memory array being logically grouped into a first memory sub-array and a second memory sub-array, respectively, from among memory sub-arrays. The decoder includes a first address decoder, a second address decoder, and failure detection circuitry. The first address decoder and the second address decoder decodes the address to provide a first control signal and a second control signal from among the control signals, respectively, the first address decoder and the second address decoder corresponding to the first memory sub-array and the second memory sub-array, respectively. The failure detection circuitry charges a failure indication line to approximately a charging voltage, samples the failure indication line at one or more instances in time, and provides a logical value to indicate the failure in the decoding of the address when the sampled failure indication line is at approximately the charging voltage.

The Detailed Description referred to accompanying figures to illustrate exemplary embodiments consistent with the disclosure. References in the disclosure to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The Detailed Description is not meant to limiting. Rather, the scope of the disclosure is defined only in accordance with the following claims and their equivalents. It is to be appreciated that the Detailed Description section, and not the Abstract section, is intended to be used to interpret the claims. The Abstract section can set forth one or more, but not all exemplary embodiments, of the disclosure, and thus, are not intended to limit the disclosure and the following claims and their equivalents in any way.

The exemplary embodiments described within the disclosure have been provided for illustrative purposes, and are not intended to be limiting. Other exemplary embodiments are possible, and modifications can be made to the exemplary embodiments while remaining within the spirit and scope of the disclosure. The disclosure has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The Detailed Description of the exemplary embodiments fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A data storage device, comprising:
    a memory array including a plurality of memory cells, the memory array being logically grouped into a first memory sub-array and a second memory sub-array, respectively, from among a plurality of memory sub-arrays; and
    a column decoder configured to:
        decode a column address within an address to access a memory cell from among the plurality of memory cells to provide a plurality of bitlines (BLs) corresponding to the column address, a first BL and a second BL from among the plurality of BLs being associated with the first memory sub-array and the second memory sub-array, respectively, and
        indicate a failure in the decoding of the column address when the first BL differs from the second BL.

2. The data storage device of claim 1, wherein the column decoder comprises:
    a first parallel address decoder and a second parallel address decoder from among a plurality of parallel address decoders configured to decode the column address to provide the first BL and the second BL, respectively, the first parallel address decoder and the second parallel address decoder corresponding to the first memory sub-array and the second memory sub-array, respectively.

3. The data storage device of claim 2, wherein the column decoder further comprises:
    failure detection circuitry configured to:
        charge a failure indication line to approximately a charging voltage,
        compare the first BL and the second BL,
        sample the failure indication line at an instance in time, and
        provide a first logical value to indicate the failure in the decoding of the column address when the sampled failure indication line is at approximately the charging voltage.

4. The data storage device of claim 2, wherein the first parallel address decoder comprises:
    a first plurality of logic circuits, arranged in a parallel configuration, configured to decode the column address to provide a first group of BLs from among the plurality of BLs, the first group of BLs including the first BL, and wherein the second parallel address decoder comprises:
a second plurality of logic circuits, arranged in the parallel configuration, configured to decode the column address to provide a second group of BLs from among the plurality of BLs, the second group of BLs including the second BL.

5. The data storage device of claim 3, wherein the failure detection circuitry comprises:
one or more logical gates configured to:
compare the first BL and the second BL,
discharge the failure indication line to be less than approximately the charging voltage when the first BL matches the second BL, and
cause the failure indication line to remain charged at approximately the charging voltage when the first BL does not match the second BL.

6. The data storage device of claim 5, wherein the one or more logical gates comprise:
a plurality of logical AND gates, a first logical AND gate from among the plurality of logical AND gates being configured to compare the first BL and the second BL; and
a logical NOR gate, having its inputs coupled to respective outputs of the plurality of logical AND gates, configured to pass a state of the failure indication line to latching circuitry.

7. The data storage device of claim 5, wherein the failure detection circuitry further comprises:
latching circuitry configured to:
sample the failure indication line at one or more instances in time in response to a failure clocking control signal, and
provide the first logical value to indicate the failure in the decoding of the column address when the sampled failure indication line is at approximately the charging voltage.

8. The data storage device of claim 7, wherein the latching circuitry is further configured to provide a second logical value to indicate no failure in the decoding of the column address when the sampled failure indication line is less than approximately the charging voltage.

9. The data storage device of claim 8, wherein the failure detection circuitry further comprises:
pre-charging circuitry configured to charge the failure indication line to approximately the charging voltage in response to a failure enable control signal.

10. A method for operating a data storage device having a memory array including a plurality of memory cells that are logically grouped into a plurality of memory sub-arrays, the method comprising:
decoding a column address within an address to access a memory cell from among a plurality of memory cells to provide a plurality of bitlines (BLs) corresponding to the column address, a first BL and a second BL from among the plurality of BLs being associated with the first memory sub-array and the second memory sub-array, respectively, from among the plurality of memory sub-arrays; and
indicating a failure in the decoding of the column address when the first BL differs from the second BL.

11. The method of claim 10, further comprising:
charging a failure indication line to approximately a charging voltage;
comparing the first BL and the second BL; and
sampling the failure indication line, and wherein the indicating comprises:
providing a first logical value to indicate the failure in the decoding of the column address when the sampled failure indication line is at approximately the charging voltage.

12. The method of claim 11, wherein the decoding comprises:
decoding the column address to provide a first group of BLs from among the plurality of BLs, the first group of BLs including the first BL; and
decoding the column address to provide a second group of BLs from among the plurality of BLs, the second group of BLs including the second BL.

13. The method of claim 11, further comprising:
discharging the failure indication line to be less than approximately the charging voltage when the first BL matches the second BL; and
causing the failure indication line to remain charged at approximately the charging voltage when the first BL does not match the second BL.

14. The method of claim 13, wherein the indicating comprises:
providing the first logical value to indicate the failure in the decoding of the column address when the sampled failure indication line is at approximately the charging voltage; and
providing a second logical value to indicate no failure in the decoding of the column address when the sampled failure indication line is less than approximately the charging voltage.

15. A column decoder for decoding a column address within an address to access a memory cell from among a plurality of memory cells in a memory array to provide a plurality of bitlines (BLs) corresponding to the column address, the memory array being logically grouped into a first memory sub-array and a second memory sub-array, respectively, from among a plurality of memory sub-arrays, the column decoder comprising:
a first parallel address decoder and a second parallel address decoder from among a plurality of parallel address decoders configured to decode the column address to provide a first BL and a second BL from among the plurality of BLs, respectively, the first parallel address decoder and the second parallel address decoder corresponding to the first memory sub-array and the second memory sub-array, respectively; and
failure detection circuitry configured to:
charge a failure indication line to approximately a charging voltage,
compare the first BL and the second BL,
sample the failure indication line at one or more instances in time, and
provide a first logical value to indicate the failure in the decoding of the column address when the sampled failure indication line is at approximately the charging voltage.

16. The column decoder of claim 15, wherein the first parallel address decoder comprises:
a first plurality of logic circuits, arranged in a parallel configuration, configured to decode the column address to provide a first group of BLs from among the plurality of BLs, the first group of BLs including the first BL, and wherein the second parallel address decoder comprises:
a second plurality of logic circuits, arranged in the parallel configuration, configured to decode the column address to provide a second group of BLs from among the plurality of BLs, the second group of BLs including the second BL.

17. The column decoder of claim 15, wherein the failure detection circuitry comprises:
   one or more logical gates configured to:
      compare the first BL and the second BL,
      discharge the failure indication line to be less than approximately the charging voltage when the first BL matches the second BL, and
      cause the failure indication line to remain charged at approximately the charging voltage when the first BL does not match the second BL.

18. The column decoder of claim 17, wherein the one or more logical gates comprise:
   a plurality of logical AND gates, a first logical AND gate from among the plurality of logical AND gates being configured to compare the first BL and the second BL; and
   a logical NOR gate, having its inputs coupled to respective outputs of the plurality of logical AND gates, configured to pass a state of the failure indication line to latching circuitry.

19. The column decoder of claim 17, wherein the failure detection circuitry further comprises:
   latching circuitry configured to:
      sample the failure indication line in response to a failure clocking control signal,
      provide the first logical value to indicate the failure in the decoding of the column address when the sampled failure indication line is at approximately the charging voltage, and
      provide a second logical value to indicate no failure in the decoding of the column address when the sampled failure indication line is less than approximately the charging voltage.

20. The column decoder of claim 19, wherein the failure detection circuitry further comprises:
   pre-charging circuitry configured to charge the failure indication line to approximately the charging voltage in response to a failure enable control signal.

* * * * *